United States Patent [19]
Lin et al.

[11] Patent Number: 5,930,138
[45] Date of Patent: Jul. 27, 1999

[54] ARRANGEMENT AND METHOD FOR DETECTING SEQUENTIAL PROCESSING EFFECTS IN MANUFACTURING USING PREDETERMINED SEQUENCES WITHIN RUNS

[75] Inventors: Yung-Tao Lin, Fremont; Zhi-Min Ling, San Jose; James Pak, Sunnyvale; Ying Shiau, San Jose, all of Calif.

[73] Assignee: Advanced Micro Devices, Inc., Sunnyvale, Calif.

[21] Appl. No.: 08/926,487

[22] Filed: Sep. 10, 1997

Related U.S. Application Data

[62] Division of application No. 08/517,960, Aug. 22, 1995, Pat. No. 5,716,856.

[51] Int. Cl.⁶ .............................. G06F 19/00; G06G 7/64; G06G 7/66
[52] U.S. Cl. ................................ 364/468.15; 364/468.16; 364/468.28; 364/551.01; 364/551.02; 437/8
[58] Field of Search ...................... 364/468.15, 468.16, 364/468.17, 461.28, 551.01, 551.02, 580, 578, 420, 490; 395/21, 22, 24, 26, 27; 438/9, 16, 17; 324/765; 382/145, 226, 228; 437/8, 939, 7; 348/6, 21, 14, 46

[56] References Cited

U.S. PATENT DOCUMENTS

| | | | |
|---|---|---|---|
| 5,219,765 | 6/1993 | Yoshida et al. | 437/8 |
| 5,226,118 | 7/1993 | Baker et al. | 395/161 |
| 5,444,632 | 8/1995 | Kline et al. | 364/468 |
| 5,450,326 | 9/1995 | Black | 364/468 |
| 5,463,555 | 10/1995 | Ward et al. | 364/468 |
| 5,464,779 | 11/1995 | Fujimaki | 437/8 |
| 5,598,341 | 1/1997 | Ling et al. | 364/468.17 |
| 5,625,816 | 4/1997 | Burdick et al. | 395/614 |
| 5,716,856 | 2/1998 | Lin et al. | 437/8 |
| 5,761,064 | 6/1998 | La et al. | 364/468.17 |
| 5,761,065 | 6/1998 | Kitter et al. | 364/468.24 |

FOREIGN PATENT DOCUMENTS

| | | |
|---|---|---|
| 0 660 385 A1 | 6/1995 | European Pat. Off. . |
| 3402656A1 | 8/1985 | Germany . |
| 4112881 A1 | 11/1991 | Germany . |

OTHER PUBLICATIONS

Scher, Gary M., "Wafer Tracking Comes of Age", Semiconductor International, pp. 126–131, May 1991.

Cervantes, Edwin, "Automated Wafer Tracking in Workstream: Managing Automation Projects", 1992 Consilium International Users' Group Conference.

(List continued on next page.)

*Primary Examiner*—William Grant
*Assistant Examiner*—Ramesh Patel

[57] ABSTRACT

An arrangement and method for detecting sequential processing effects on products to be manufactured in a manufacturing process orders a first set of the products in a first specified processing sequence for a first process step in the manufacturing process. In order to prevent any positional trend created at one process step from being carried over into the next process step, the first set of the products is re-ordered into a second, different specified processing sequence for a second process step in the manufacturing process. Data regarding responses of the first set of the products to the process steps are extracted. The extracted data are correlated with the first and second processing sequences and data analysis is performed on the correlated extracted data. These steps are repeated for subsequent sets of the products, so that although the specified processing sequence is different for each of the individual process steps for a set of products, the same processing sequences for the individual processing steps are used for subsequent sets of the products to be manufactured. Since the processing sequences are not randomized from set to set and do not have to be provided to a database, the amounts of interfacing and disk storage needed are greatly reduced.

7 Claims, 7 Drawing Sheets

OTHER PUBLICATIONS

Ramberg, John S., "Designing Simulation Experiments: Taguchi Methods and Response Surface Metamodels", pp. 167–176, Proceedings of the Winter Simulation Conference, 1991.

Saint–martin, Xavier et al., "Wire–Bonding Machine Optimization Using Taguchi Method", pp. 74–83, Proceedings of the International Electronic Manufacturing Technology Symposium, 1992.

Danie, David W. et al., "Identifying an Etch Process Window Using Response Surface Methodology", Solid State Technology, vol. 31, No. 9., 1988.

Jones, Ken et al., "The Comparison of Response Surface and Taguchi Methods for Multiple–Response Optimization Using Simulation", Proceedings of 13th IEEE/CHMT IEMS, 1992.

ARRANGEMENT AND METHOD FOR DETECTING SEQUENTIAL PROCESSING EFFECTS IN MANUFACTURING USING PREDETERMINED SEQUENCES WITHIN RUNS

This application is a division of application Ser. No. 08/517,960 filed Aug. 22, 1995, now U.S. Pat. No. 5,716,856.

BACKGROUND OF THE INVENTION

1. Technical Field of the Invention

The present invention relates to the field of manufacturing of products, such as wafers containing semiconductor devices, and more particularly, to the improvement of manufacturing processes for these products. By comparing response variables with a process sequence of products, the sources of variation due to the order of processing of products through the process steps in the manufacturing process are determined.

2. Description of Related Art

The manufacture of most products, such as wafers containing semiconductor devices, requires a number of discrete processing steps to create the product. For the example of wafers, a number of discrete steps are needed to produce a packaged semiconductor circuit device from raw semiconductor material. The starting substrate is usually a slice of single crystal silicon referred to as a wafer. Circuits of a particular type are fabricated together in batches of wafers called "lots" or "runs". The fabrication process creates regular arrays of a circuit on the wafers of a lot. During processing, the individual wafers in a lot may go through individual processing steps one at a time or as a batch. At the completion of wafer processing the wafers are tested to determine circuit functionality. Later the wafers are sliced, the functioning products are packaged, and further testing occurs prior to use by the customer.

Data gathered during the course of wafer processing is used to diagnose yield problems and forms the basis of yield improvement efforts. Such data includes parametric electrical test data gathered on individual circuits and test structures fabricated on the wafers, as well as test data referred to as wafer sort data which tests the suitability for use once wafer processing is completed.

One of the possible sources of yield variation is the order at which wafers in a lot are processed at a given processing step. When the processing is done one wafer at a time at a step, a variation in yield may be due to build up of contaminants, heating of a processing chamber, or another physical effect which changes during the processing of the lot. In a batch operation, the physical location of the wafer in the batch processing equipment may influence uniformity of the processing effects across the lot. The benefits of tracking the order of wafer processing at critical processing steps and correlating this processing order to device performance (i.e., examining a linear correlation coefficient) in order to improve yields are well known. See, for example, "Wafer Tracking Comes of Age", Gary Scher, Semiconductor International (May 1991, pp. 126–131).

As an example, consider a critical lithography step in which the wafers in a lot are processed one at a time through a lithography system called a stepper. Assume that there is a contamination problem which causes contamination to build up on the chuck holding the wafer in place during exposure which worsens with each wafer processed. Normal practice may require the chuck to be cleaned prior to each lot being started. The contamination buildup causes the upper wafer surface to deviate from the ideal focal plane during exposure and irregular features are produced upon exposure. If the order in which each wafer is processed is known, then the final wafer yield may be plotted against the processing order in this step. In this example, for each wafer in the lot a drop-off in yield with processing order would be observed due to the contamination problem. Armed with this knowledge, process engineers responsible for this step could then begin work on fixing the problem and hence improving yield and profitability.

The tracking of the wafer processing order in the prior art used specialized equipment to read scribed wafer identifiers either immediately prior to or after critical processing steps and to store this data for later correlation with device performance. Randomizing the order of the wafers prior to such steps is often done to ensure effects are not confounded. The wafer positional data is fed into a computer system, the device performance metrics for a wafer lot of interest are manually entered, and then all possible graphs of the device metrics for that lot versus wafer processing order at each step are generated. An analyst reviews the graphs and examines linear correlation coefficients to determine those steps at which the processing order may affect performance by manually discerning trends in the graph plots.

Keeping track of the wafer-processing sequence within a run provides an efficient method of identifying the sources of systematic, wafer-positional effects on die yield and device parameters. However, most processes comprise many steps. Although the randomization of the wafer order at each step prevents any positional trend in one sector being carried over into the next sector, thereby isolating the sector responsible for the trend, there are high costs associated with this method. First, the machines needed to perform the randomization at each step requires an interface with the database to record the randomized sequences. The hardware or software to implement each interface is very costly. In a large fab, where there are many process steps, a large number of machines are needed for randomizing and interfacing with the database, making the financial costs extremely high.

A second problem associated with the above-described method is the amount of data generated in this system is exceptionally large. This data includes the order of the wafers at each processing point, for each lot of wafers. Hence, each lot of wafers is randomized differently at each processing step for the different lots of wafers. This information must then be stored for each lot of wafers. The disk space needed to store this amount of data greatly increases the overall cost of the system, and the increased number of software interfaces also reduces the reliability of the system.

SUMMARY OF THE INVENTION

There is a need for a systematic method and arrangement for the automatic detection of sources of variation due to sequential processing effects across a number of processing steps used to manufacture products, such as wafers containing semiconductor circuits, but with reduced costs with respect to earlier methods.

This and other needs are met by the present invention which provides a method for detecting sequential processing effects on products to be manufactured in a manufacturing process, comprising ordering a first set of the products in a first specified processing sequence for a first process step in the manufacturing process. The first set of the products are re-ordered in a second specified processing sequence for a second-process step in the manufacturing process, the first specified processing sequence being different from the second specified processing sequence. Data regarding responses of the first set of the products to the process steps in the manufacturing process are extracted. The extracted data are correlated with the first and second processing sequences and data analysis is performed on the correlated extracted data. The steps are repeated for a second set of the products. The first specified processing sequence for the second set of the products is the same as the first specified processing sequence for the first set of the products, and the second specified processing sequence for the second set of the products is the same as the second specified processing sequence for the first set of the products.

The above described method greatly reduces the costs associated with determining systematic, product-positional effects on die yield and product parameters. The method of the present invention is able to achieve this since the same processing sequence at each step is used for each set of products, although the processing sequences vary for each step within each set of products. Unique randomization for every set of products to be processed is therefore avoided, along with the attendant storage of the multitude of different processing sequences for each of the different process steps.

The earlier stated needs are also met by another aspect of the present invention which provides an arrangement for detecting sequential processing effects on products to be manufactured in a manufacturing process. The arrangement comprises a plurality of processing apparatuses that perform different respective processing steps of the manufacturing process on the products. A detector detects a response variable of the products. A memory stores a processing sequence of the products for each processing step, the processing sequence of each processing step being different from the processing sequence of each other processing step. The processing sequences for the different processing steps are maintained for different lots of products such that each lot of products is processed in the same respective processing sequence at each of the different processing steps of the manufacturing process. A data processor plots the response variable for each product against the stored processing sequence of the products for each processing step and determines whether there are any systematic, device-positional effects on yield of the devices.

The foregoing and other features, aspects and advantages of the present invention will become more apparent from the following detailed description of the present invention when taken in conjunction with the accompanying drawings.

DESCRIPTION OF THE ILLUSTRATIVE EMBODIMENTS

The present invention will be described in the context of the manufacture of semiconductor devices. This is exemplary only, however, as the method of the invention is applicable to the manufacture of other types of products produced by a plurality of processing steps.

Figure 1:
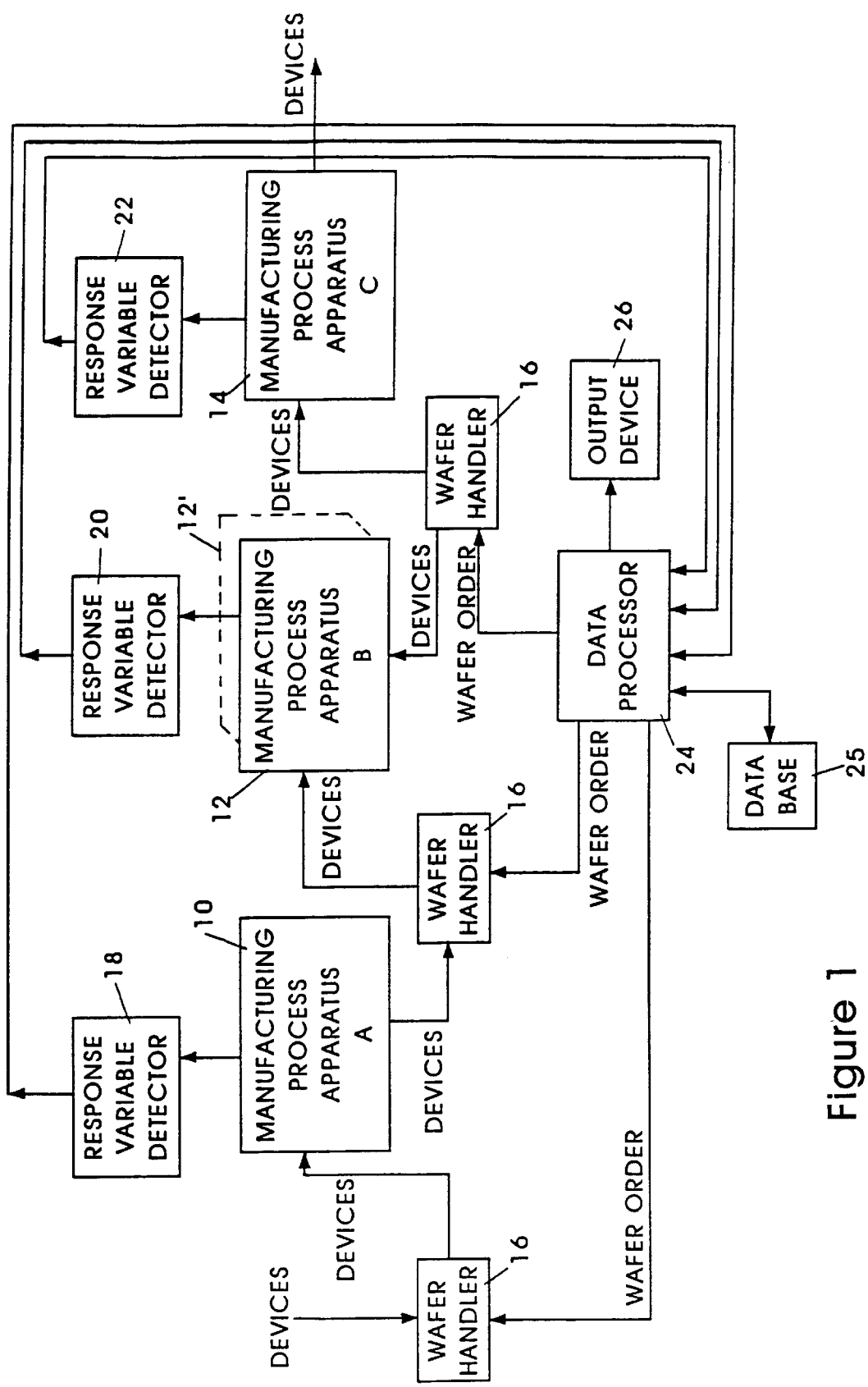
FIG. 1 is a block diagram of a manufacturing arrangement and a process analysis device constructed in accordance with an embodiment of the present invention.

FIG. 1 is a block diagram depicting a semiconductor device processing arrangement and an arrangement for analyzing the process, in which the wafers are re-ordered in the different processing steps for each order. The semiconductor wafers are processed (as indicated by the arrows) in a sequence by a plurality of manufacturing process apparatuses 10–14. A first manufacturing process apparatus "A" (reference numeral 10) performs one or more manufacturing process steps on a plurality of wafers in a known sequence of the wafers. The sequencing of the wafers is performed in preferred embodiments by a wafer handler 16, such as a conventional scribe reader that reads wafer identification information that is scribed on the individual wafers.

After processing by the manufacturing process apparatus A (10), the wafers then undergo processing by manufacturing process apparatus "B" (reference numeral 12). One or more processing steps are performed by this manufacturing process apparatus B (12). The processing sequence of the wafers is re-ordered again by another wafer handler 16. This processing sequence is changed in preferred embodiments from the processing sequence of the wafers for the process steps performed by manufacturing process apparatus A (10). The changing of the processing sequence between processing steps prevents confounding of any processing sequence effects.

A third manufacturing process apparatus "C" (reference numeral 14) performs further processing step(s) on the wafers in a different processing sequence of the wafers.

In order to perform the process analysis of the present invention, response variable detectors 18, 20, and 22 are provided at the individual manufacturing process apparatuses 10, 12, and 14. These response variable detectors 18–22 detect at least one response variable of the product, such as a wafer, that is being manufactured. For example, the response variable may be the threshold voltage across the wafers, or it may be a degree of wafer streaking after a polysilicon etching of the wafers. The response variable detectors 18–22 may detect the same or different response variables according to the manufacturing process apparatus 10–14 with which the individual detector is associated.

In certain preferred embodiments, only one response variable detector is used to measure a desired response variable of the devices after all of the processing steps are completed.

The data detected by the response variable detectors 18–22 is collected by a data processor 24. After processing this data, the data processor 24 applies control chart rules to the data and provides the control charts for which a control chart rule was violated to an output device 26. The output device 26 may be a printer or a video display, for example. An exemplary embodiment of the analysis will be discussed later.

The present invention does not randomly re-order the wafers at each processing step represented in FIG. 1 by the three manufacturing process apparatuses 10, 12 and 14. Rather than randomizing in this way, reading the randomized wafer order, and downloading the randomized wafer order to the data processor 24, the wafers (devices) are rearranged in predetermined orders at each of the different steps. Every lot of the same manufacturing process is processed using the same order of wafers; therefore, the data analysis utilizes a simple table that stores the order for each step, and the same table is used for all of the lots. An example of a pre-determined wafer-order table is provided in Table 1 below.

TABLE 1

| Order in Cassette | wafer ID (App. A) | wafer ID (App. B) | wafer ID (App. C) |
| --- | --- | --- | --- |
| 1 | 16 | 4 | 23 |
| 2 | 3 | 14 | 9 |
| 3 | 14 | 10 | 1 |
| 4 | 11 | 2 | 13 |
| 5 | 23 | 7 | 10 |
| 6 | 5 | 1 | 15 |
| . | . | . | . |
| . | . | . | . |
| . | . | . | . |
| 22 | 7 | 21 | 3 |
| 23 | 13 | 8 | 7 |
| 24 | 15 | 11 | 8 |

Using the above table, the wafers in slots 1–24 in a cassette are re-ordered for processing by manufacturing process apparatus A (reference numeral 10 in FIG. 1) according to the wafer ordering table. Hence, the wafer in slot 16 (having a wafer scribe identification (ID) of 16) is moved to slot 1 in the cassette for processing by manufacturing process apparatus A. Similarly, the wafer with the wafer scribe ID of 3 is moved to slot 2, and so on, until all of the wafers are re-ordered in the cassette. The re-ordered wafers are then processed by manufacturing process apparatus A (10).

After processing in step A, the wafers are re-ordered again before processing by manufacturing process apparatus B (reference numeral 12). The re-ordering is again performed according to Table 1, but this time in the sequence in the second column. This re-ordering between steps prevents any confounding of errors. The re-ordering of the wafers is performed again after processing in step B and before step C, and so on for as many steps as necessary in the manufacturing process.

The wafer ordering table above is exemplary only, as other sequences of wafers can be used at each step. In preferred embodiments, the re-ordering of the wafers is performed between processing steps for the wafers of each lot according to the wafer ordering table. The same table is then used to re-order the wafers of each different lot of wafers. The first twenty-four wafers (lot l) will therefore be processed at each of the steps A–C in the same order as the second twenty-four wafers (lot 2), and so on for each lot. The randomization occurs between steps, but not between lots.

The randomization of the wafers between processing steps, but not between lots, provides the advantages of identifying the sources of systematic, wafer-positional effects on die yield and device parameters at a much lower storage and computational cost. The wafer handlers 16 are simply used to read the wafer scribe IDs and rearrange the wafer orders at the designated manufacturing process steps. In certain preferred embodiments, the wafer order table is stored in the wafer handlers 16. An interface with a database 25 for each wafer handler 16 is rendered unnecessary by the present invention. Instead, only one relatively small table need be stored in the database 25, rather than storing different wafer orders for every lot at every manufacturing process step. When the analysis is performed by the data processor 24 on the data gathered by the response variable detectors 18–22, the order of the wafers at each step is already known and stored in the database 25. The data processor 24 then correlates the yield and/or device readings of each wafer against the pre-determined wafer order at each processing step.

The present invention allows extremely low cost randomization and re-ordering to be performed, since the wafer handlers 16 can be replaced by human operators who simply read the wafer scribe IDs and reorder the wafers according to a given wafer order table. This permits startup manufacturers or developing countries to implement randomization to isolate a manufacturing process step (or sector) responsible for a positional trend, but at a reasonable cost.

The predetermined wafer orders are randomly generated when the manufacturing process is initially set up. The randomized order may be determined by a computer, such as a conventional personal computer. Verification is made in preferred embodiments to ensure that the particular randomly generated wafer orders are mutually independent.

Figure 6:
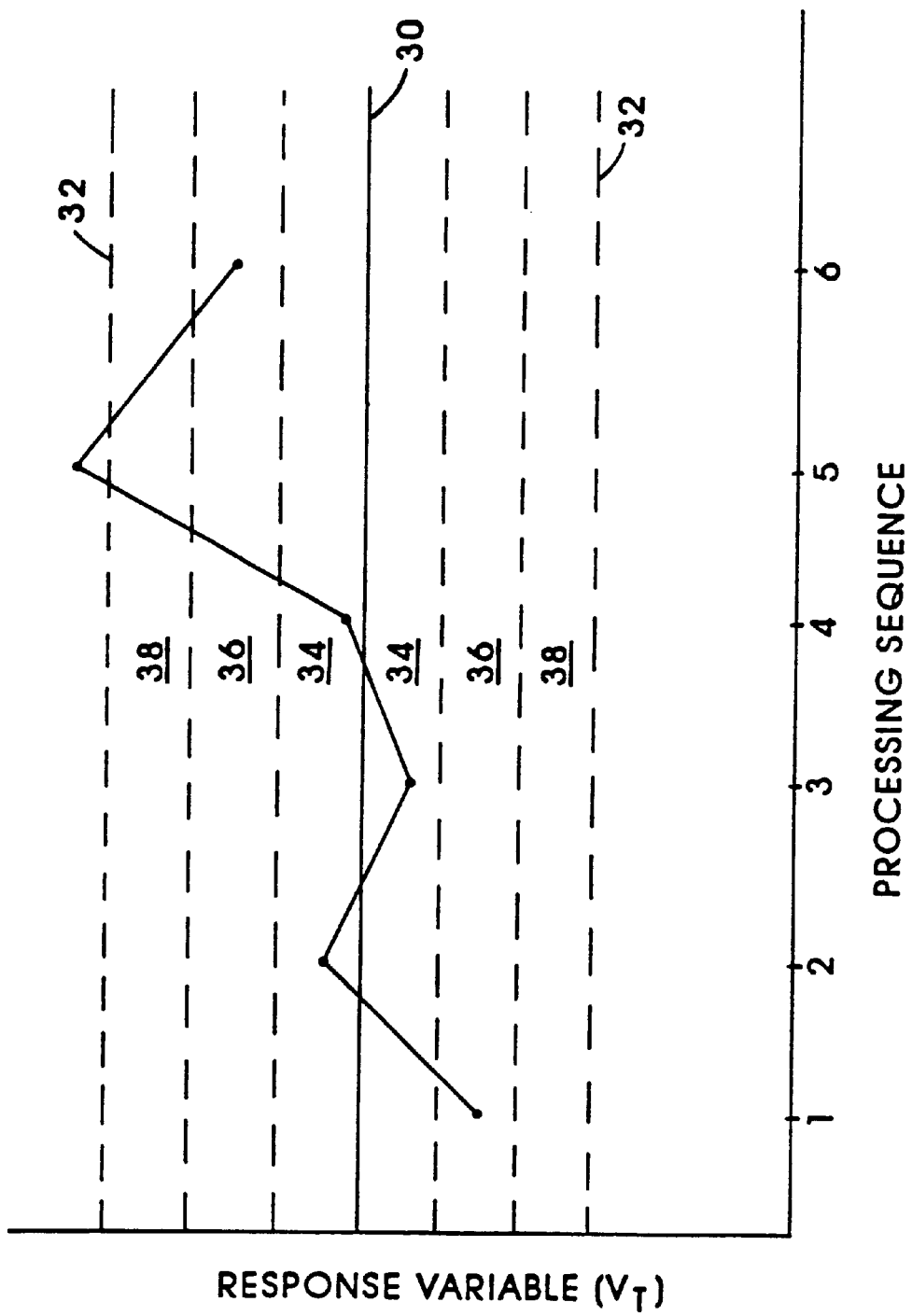
FIG. 6 is a control chart depicting the different sigma zones for explanation of the use of Western Electric control chart rules.

Once the data has been gathered for the wafers that have been re-ordered as described above, the processing by the data processor 24 may be completed. This processing may include the generation of control charts. Control charts are plots of a response variable against some series of sampling points forming a fluctuating pattern and having statistical limits. The statistical limits provide a reference for determining whether the process is in control or whether there is a lack of control. An example of a so-called "Shewhart" control chart is provided in FIG. 6 and depicts the threshold voltage across a wafer plotted against the position of a wafer in a processing step. The control chart has a centerline 30 formed by averaging the response variables for each of the points. The statistical limits are determined according to well-known statistical formulas (see for example, the "Statistical Quality Control Handbook", AT&T Technologies, Del Mar Printing, Charlotte, N.C. (1956, page 7). These statistical limits are provided with reference numeral 32, and are often referred to as 3 sigma control limits.

Shewhart charts have long been used in process control applications to detect excursions of manufacturing process variables due to assignable causes. The typical use of Shewhart charts is in manufacturing situations in which there is a constant flow of material and a periodic sampling of this constant flow of material is performed to measure a certain characteristic. A chart is plotted with the response variable along the vertical axis and a sample identifier, commonly referred to as the subgroup, is plotted along the horizontal axis in the order which the samples were taken. Non-random excursions of the response variable are detected by applying a set of rules, such as the "Western Electric rules", to the latest points on the plot. These rules are based on the statistical likelihood of such events as a 3-sigma deviation from the mean, so many points in a row either above or below the mean, etc. Further explanation of Shewhart charting and Western Electric rule usage can be found in most introductory text books on process control applications in manufacturing, such as the "Statistical Quality Control Handbook", supra.

Although Shewhart charts have been used in the past to analyze continuous flow processes, the use of such charts and the application of Western Electric control rules to the charts to analyze data within a batch of devices has not been described in the prior art. The automatic detection of sequential processing effects is made possible, however, by the use of Shewhart charts and the application of control rules as in the present invention. This makes the detection of sequential processing effects in the manufacture of semiconductor devices, for example, less tedious and time consuming for process engineers.

Preferred embodiments of the present invention produce Shewhart "individual" charts and "moving range" charts of the response variable plotted against processing sequence for each processing step. Such charts are well known to those of ordinary skill in the art and are described in the "Statistical Quality Control Handbook", supra. If desired, the data may be further subdivided to produce separate charts for each particular machine processing apparatus at each step. The individuals and moving range charts are used in preferred embodiments due to their sensitivity to the component of variation between subgroups. Since the subgroups in integrated circuit manufacturing represent the order at which the wafers of each lot were processed at a step, a chart which is sensitive to the component of variation between subgroups is most useful.

Referring back to FIG. 6, for purposes of analysis, the areas within the 3 sigma control limits 32 can be further subdivided into three sigma control zones. The first zone is the 1 sigma control zone 34, closest to the centerline 30 on both sides. The second zone is the 2 sigma control zone 36, and the third zone is the 3 sigma control zone 38. Based on where the plotted points fall in relation to these three zones, the application of control chart rules will determine whether there is any statistical significance to the variability due to the processing sequence of the wafers.

Control chart rules are well known, and one set of rules, the Western Electric rules was mentioned previously. For instance, in order to test for statistical significance, it is determined whether any point falls outside of the 3 sigma control zone 38. This indicates that the plot of points is unnatural and the particular process step should be investigated further. Another test (or rule) is whether two out of three successive points fall within 3 sigma control zone 38 or beyond. A further test is whether four out of five successive points fall in the 2 sigma control zone 36 or beyond. A still further test is whether eight successive points fall in the 1 sigma control zone 34 or beyond (in other words, on one side of the centerline 30).

Based on the gathered data for the various process steps performed by the different manufacturing process apparatuses 10, 12, 14, the data processor 24 plots the response variable in relation to the wafer position and then applies control chart rules, such as the Western Electric rules, to the plots. When there is a chart rule violation in one of the plots, indicating statistical significance to the processing sequence of the wafers, the data processor 24 creates the chart with the output device 26. A process engineer can then use this generated chart to conduct testing on the processing step and plan a corrective course of action. Since only charts with rule chart violations are generated, the process engineer does not have to sift through a plethora of charts to determine which ones have statistical significance for the processing sequence.

In certain preferred embodiments, the data processor 24 will generate charts in an order that is determined based on the specific rule which has been violated and prior experience with the importance of specific rule violations to the given application. The information contained within these charts is then used to prioritize the efforts of engineering groups responsible for those process steps in the manufacturing area at which there were rule violations. Further investigation may be warranted to understand the significance of the signals produced by the rule violations. After further characterization and consideration of cost issues, it may be desirable to eliminate a particular source of process sequence variation which has been highlighted by the above method.

Figure 2:
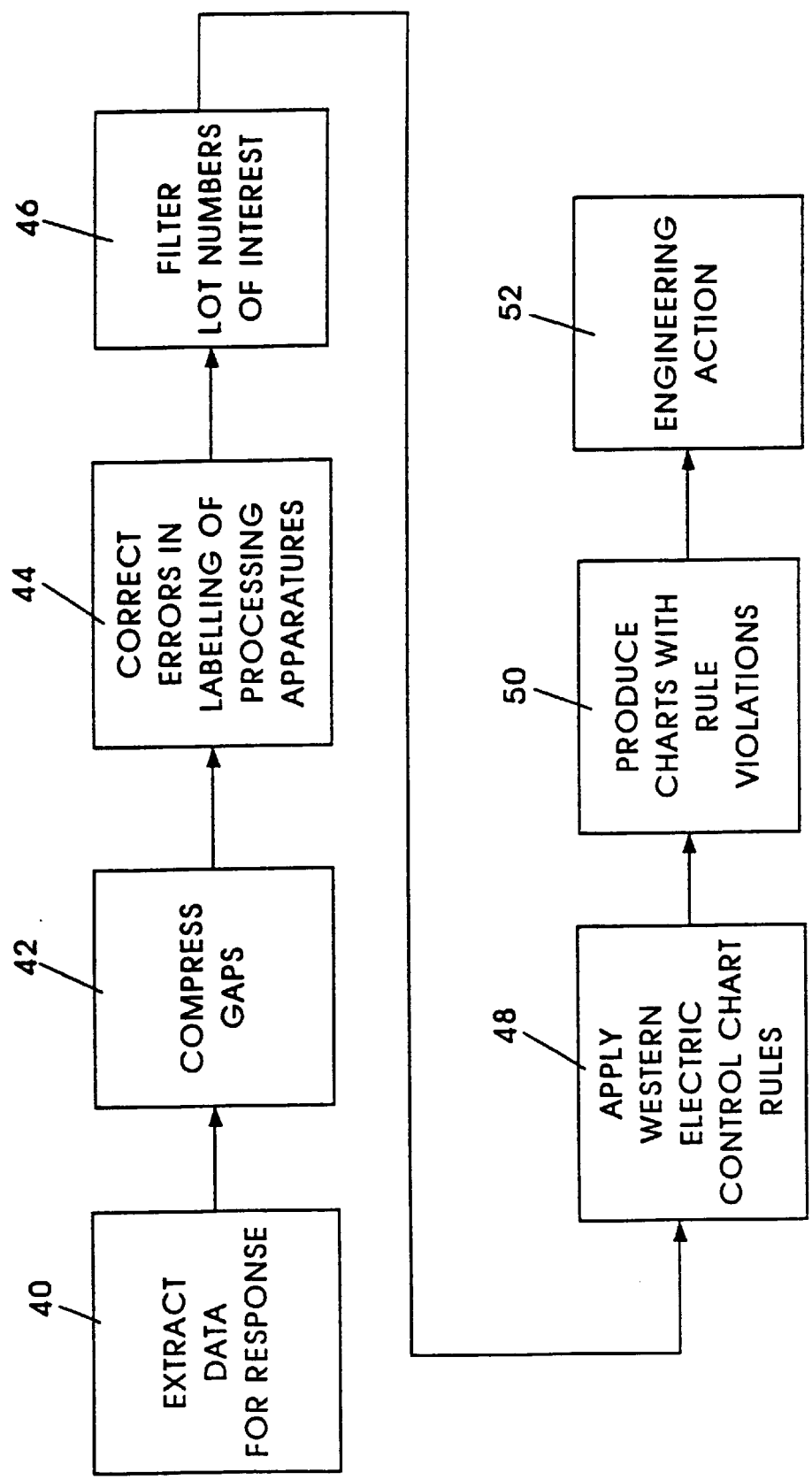
FIG. 2 is a flow chart of an exemplary embodiment of the method of the present invention.

An embodiment of an exemplary method of performing the data analysis is depicted in FIG. 2. In a first step 40, the response variable data from the response variable detectors 18–22 are extracted by the data processor 24, and the wafer ordering table is retrieved from the database 25. In step 42, gaps in the numerical recording are compressed by the data processor 24, as will be described in more detail later.

After compression, errors in the labelling of the manufacturing processing apparatus 10–14 are corrected in step 44. In the actual arrangement of the manufacturing process devices 10–14, a plurality of apparatuses may be used to perform the same process step on different lots of wafers. This is indicated by the manufacturing process apparatus 12'. It is often the case that these apparatus labels (or identifiers) are entered manually into the data processor 24 and are therefore subject to data entry errors. Hence, correction of errors in the labeling of the apparatuses used is necessary when it is to be determined whether individual pieces of apparatus at a given processing step behave differently with respect to their ability to produce desired device performance. This correction may be performed using any of a number of algorithms based on a closest pattern match to select the correct apparatus when labelling errors are detected.

An additional step that is provided in certain preferred embodiments is the filtering of lots of interest (step 46). This step is performed if the dataset contains more data than is of interest for the current investigation. For example, it may be desirable to restrict the data to one or more lots of interest, or to those lots which went through a specific step during a certain period of time.

After the data has been refined in steps 42, 44 (and optionally step 46), collectively referred to as the data refining steps, the control chart rules are applied in step 48 to the data represented in the plots in the manner described earlier to determine if there are rule violations. The charts with rule violations are generated in step 50 and appropriate engineering action is taken in step 52.

Figure 3:
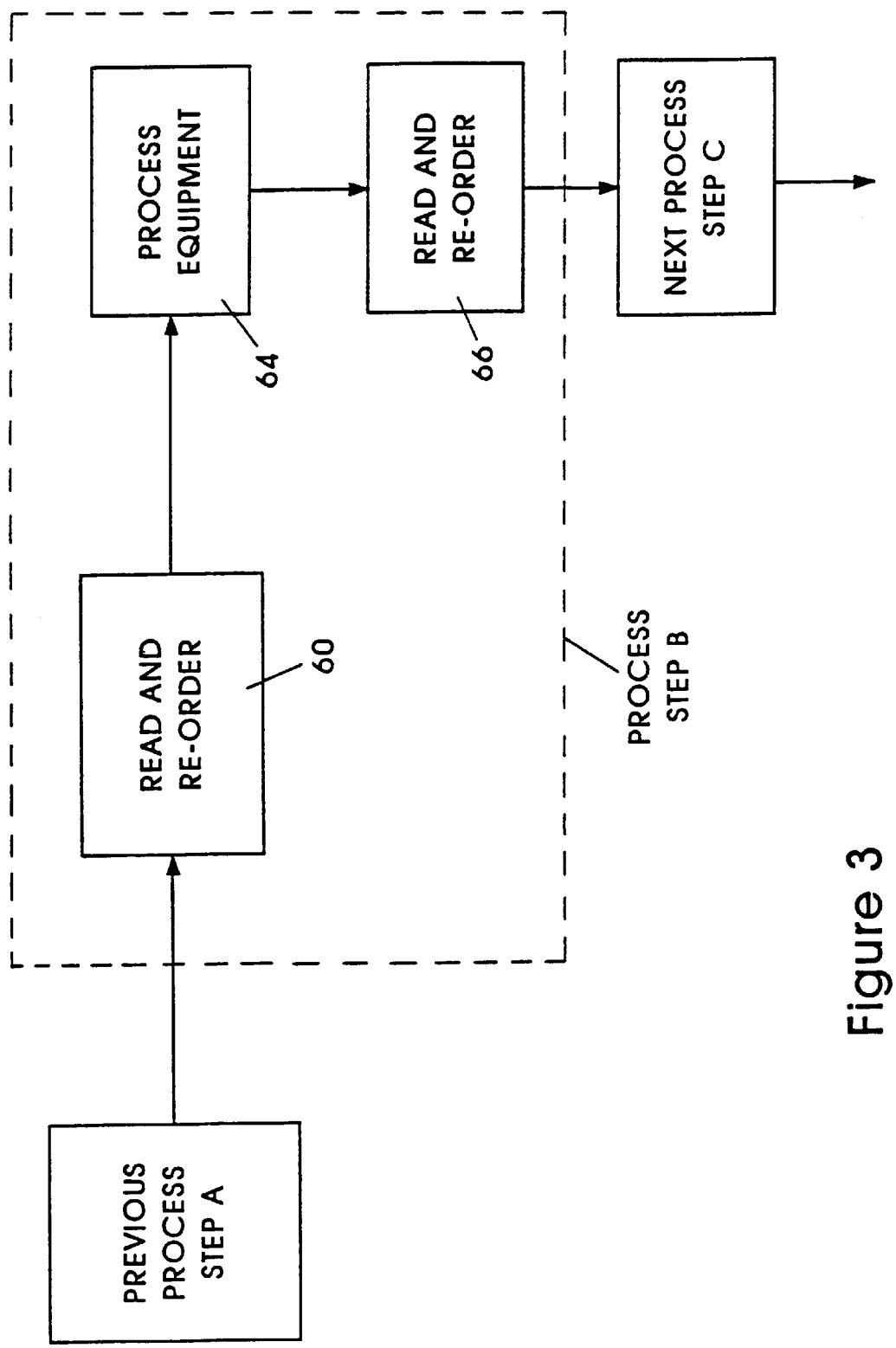
FIG. 3 is a flow chart of a process for collecting process sequence data from a step of an exemplary manufacturing process in accordance with an embodiment of the present invention.

An embodiment of the method for extraction of the response variables (i.e. the collection of the process sequence data) is depicted in FIG. 3 for a single process step B. From the previous process step A, the wafers are identified and re-ordered in step 60 to confound any error. This identification and re-ordering may be done either manually or with a wafer handler 16 that has a stored wafer order table. The wafers then undergo the specific processing step in step 64. After processing, the wafers are again re-ordered according to the wafer order table in step 66 prior to being processed in process step C. The use of compression as in step 42 of the method of the invention depicted in FIG. 2 refines the data prior to the plotting of the response variable against the processing sequence. The compression of sequence information across gaps in the numerical recording is necessary, for example, in cases in which there are empty slots in the cassettes holding the wafers when they are being read, but these gaps are eliminated when the wafers are loaded into the processing equipment.

Figure 4:
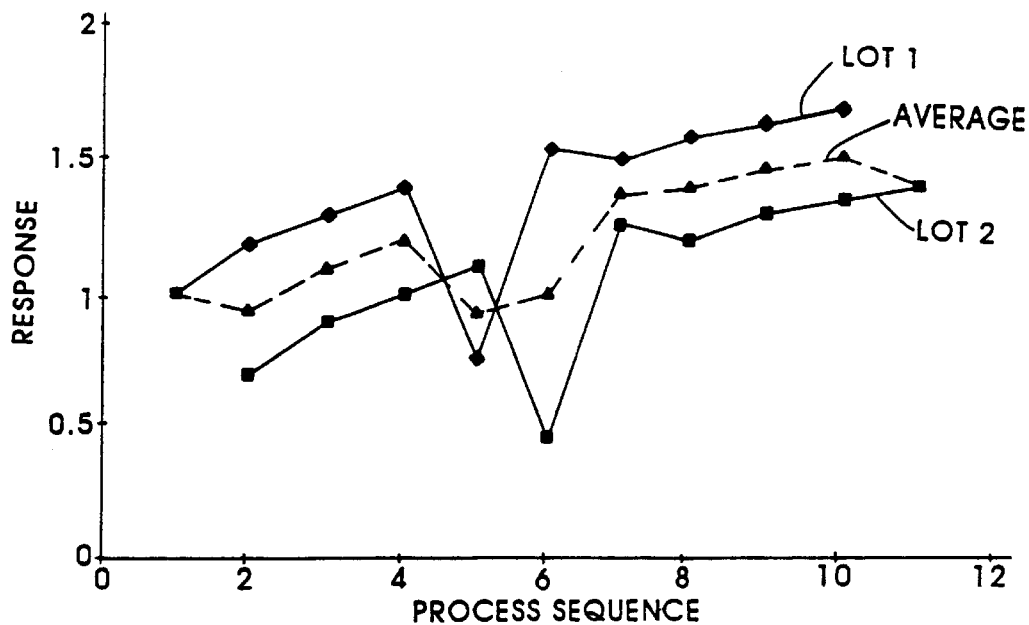
FIG. 4 is an exemplary control chart prior to compression.
Figure 5:
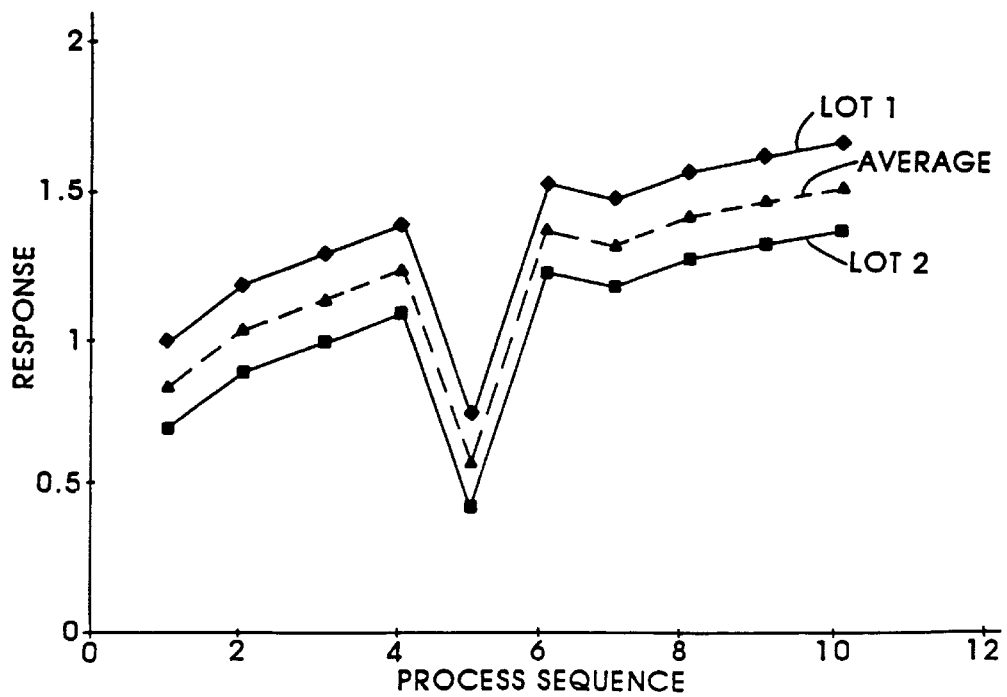
FIG. 5 is an exemplary control chart containing the same information as the control chart of FIG. 4, but after compression.

FIGS. 4 and 5 illustrate the need for compression in order to provide an accurate picture to the data processor 24 of any sequential processing effects. In FIG. 4, lot 1, with ten devices, has been processed and the response variable measured. A second lot, lot 2, has also been processed, but for some reason such as an empty slot in the cassette, the numerical recording of the first device in that lot is registered as two. The last device of that lot is registered as device eleven. An average of the response variable for lot 1 and lot 2 does not yield a sharp dip, as do the plots of the individual two lots.

After compression of any gaps in the data, the average of the response variable will present a more accurate picture of any sequential processing effects. As seen in FIG. 5, the same lots as in FIG. 4 are illustrated. However, lot 2 has been compressed to remove the gap between product 1 and product 2. In this example then, the entire plot of lot 2 is shifted to the left by one position. The average of the two lots now exhibits a sharp dip at device 5 in the processing sequence, and hence accurately portrays the response vs. processing sequence for that process step.

Figure 7:
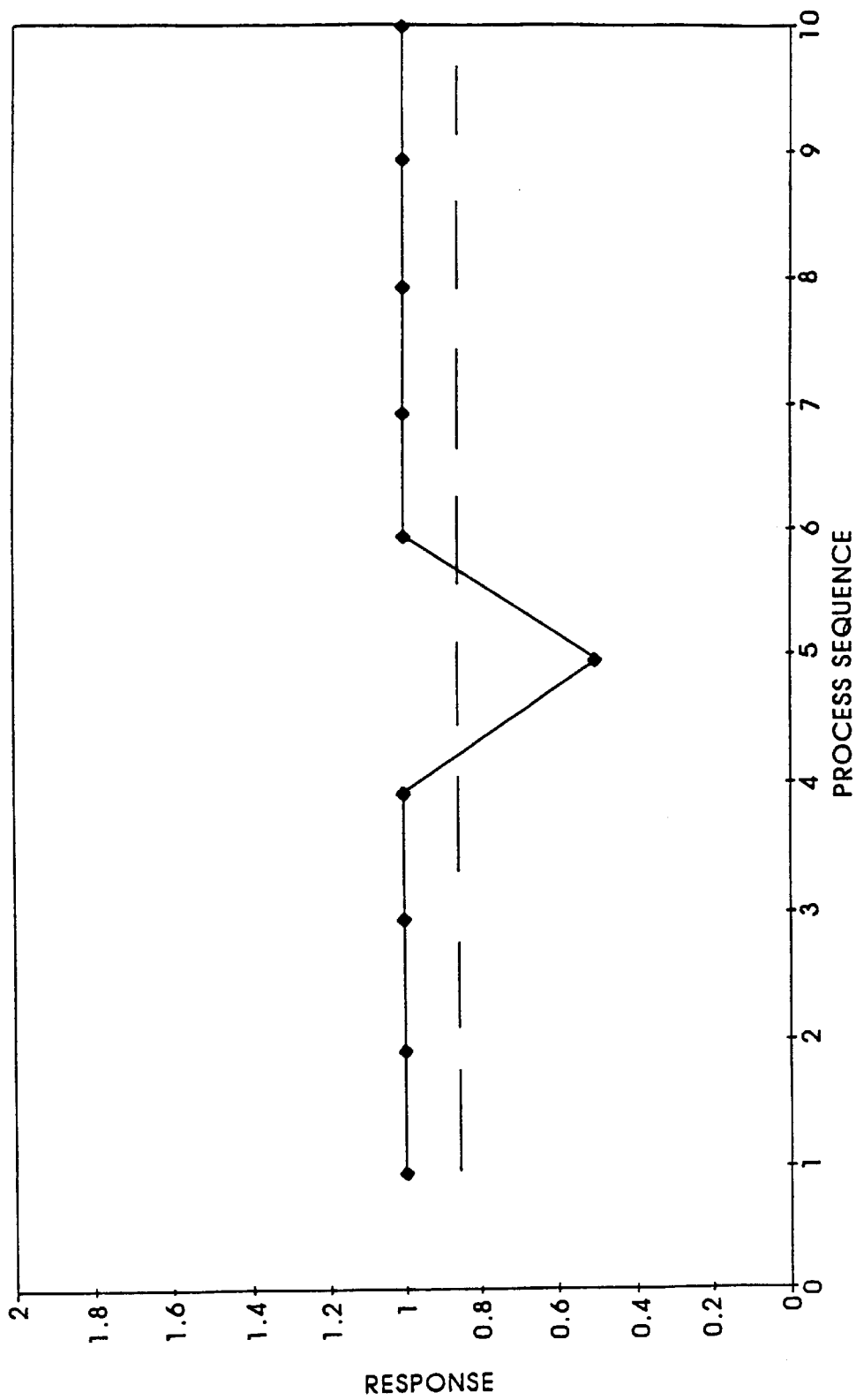
FIGS. 7 and 8 are examples of Shewhart charts.
Figure 8:
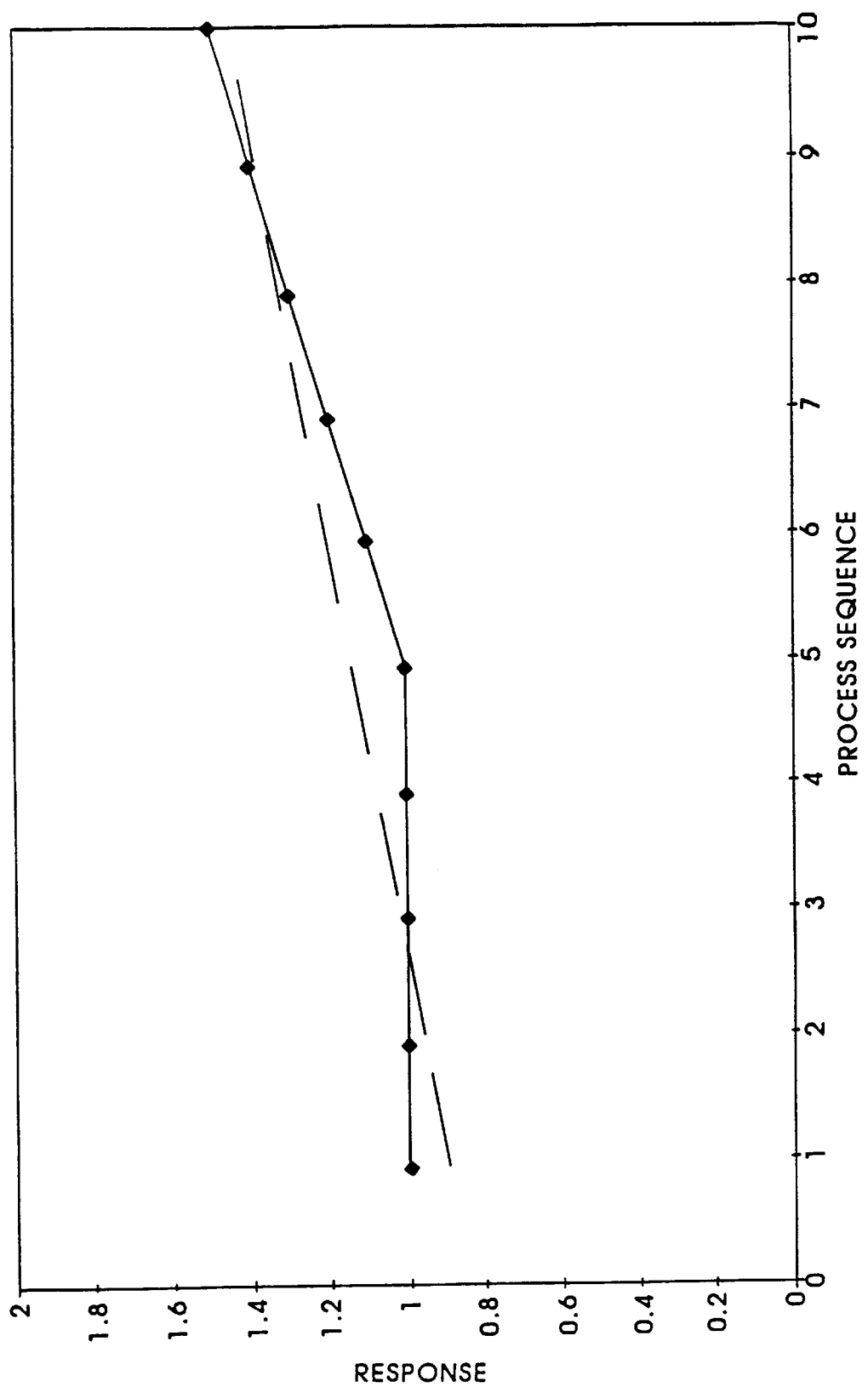

The application of Shewhart charts and Western Electric control rules to the Shewhart charts within a batch or individual lot as in the present invention allows the detection of sequential processing effects in the manufacturing of products that would be missed using other detection methods. FIGS. 7 and 8 are exemplary plots that illustrate this advantage of the present invention over the prior art detection methods that produce and examine a linear correlation coefficient for scatter plots.

FIG. 7 depicts a 3 sigma rule violation in which devices 1–4 and 6–10 in the processing sequence all have a response of 1.0, but device 5 has a response below 0.5, out of the 3 sigma zone. Applying the Western Electric rules to this plot as in the present invention reveals a chart rule violation and identifies this process step as one that should be investigated further by process engineers. Using earlier methods of producing a linear correlation coefficient, however, a response average just above 0.8 is realized, as indicated by the dashed line. This line has a correlation coefficient of zero and the earlier methods would therefore miss the processing effect that is present.

FIG. 8 is another example of process sequence variability which is detected using the present invention, but would not by the use of linear correlation coefficients as in earlier methods. In this example, there is no variability in process sequence through position 5 at which point there is a gradual increase upward in the response. A line that is fitted to this data yields the dashed curve. Since the slope of the line is small, the linear correlation coefficient is also small and therefore the prior art would again detect no effect. However, the application of control chart rules, such as the Western Electric rules, would detect the effect due to the rule that makes it improbable that so many points in a row would be monotonically increasing due to random chance.

Hence, the data analysis used in conjunction with the present invention will detect sequential processing effects that would be missed by methods employed by the prior art. Further, the arrangement and method of the present invention for detecting sequential processing effects in manufacturing described above may be advantageously utilized to detect effects in processes other than that of the manufacture of integrated circuit devices.

Although the present invention has been described and illustrated in detail, it is clearly understood that the same is by way of illustration and example only and is not to be taken by way of limitation, the spirit and scope of the present being limited only by the terms of the appended claims.

We claim:

1. An arrangement for detecting sequential processing effects on products to be manufactured in a manufacturing process, comprising:

a plurality of processing apparatuses that perform different respective processing steps of the manufacturing process on the products;

a detector that detects a response variable of the devices;

a memory for storing a processing sequence of the products for each processing step, the processing sequence of each processing step being different from the processing sequence of each other processing step, wherein the processing sequences for the different processing steps are maintained for different lots of products such that each lot of products is processed in the same respective processing sequence at each of the different processing steps of the manufacturing process; and a data processor that produces plots of the response variable for each product against the stored processing sequence of the products for each processing step and determines whether there are any systematic, product-positional effects on yield of the products.

2. The arrangement of claim 1, wherein the data processor includes means for applying control chart rules to the plots, determining whether there are any rule violations based on the application of the control chart rules to the plots, and generating a control chart having a rule violation in response to the determination of a rule violation.

3. The arrangement of claim 2, further comprising a plurality of product handlers, each product handler re-ordering the products between processing steps in accordance with the processing sequence for the next processing step to be performed on the products.

4. The arrangement of claim 3, wherein each product handler includes means for storing the processing sequence for the next processing step,.

5. The arrangement of claim 3, further comprising means for initially randomly generating the processing sequences for the different processing steps for a first set of the products to be manufactured, the same processing sequences being used for the different processing steps for all subsequent sets of products to be manufactured within a run of sets of products.

6. The arrangement of claim 3, wherein the product handlers are wafer handlers, and the devices are wafers.

7. The arrangement of claim 1, wherein the memory includes means for storing the processing sequences for the different processing steps in tabular form.

* * * * *